United States Patent
De et al.

(10) Patent No.: US 7,797,123 B2
(45) Date of Patent: Sep. 14, 2010

(54) METHOD AND APPARATUS FOR EXTRACTING ASSUME PROPERTIES FROM A CONSTRAINED RANDOM TEST-BENCH

(75) Inventors: Kaushik De, Bangalore (IN); Eduard Cerny, Worcester, MA (US); Pallab Dasgupta, Kharagpur (IN); Bhaskar Pal, Bangalore (IN); Partha Pratim Chakrabarti, Kharagpur (IN)

(73) Assignee: Synopsys, Inc., Mountain View, CA (US)

( * ) Notice: Subject to any disclaimer, the term of this patent is extended or adjusted under 35 U.S.C. 154(b) by 9 days.

(21) Appl. No.: 12/144,039

(22) Filed: Jun. 23, 2008

(65) Prior Publication Data

US 2009/0319252 A1  Dec. 24, 2009

(51) Int. Cl.
*G06F 11/26* (2006.01)
*G06F 11/263* (2006.01)

(52) U.S. Cl. .................. 702/117; 702/118; 702/119; 702/123; 716/4

(58) Field of Classification Search .......... 702/117, 702/118, 119, 123
See application file for complete search history.

(56) References Cited

U.S. PATENT DOCUMENTS

| | | | | |
|---|---|---|---|---|
| 5,901,073 A | * | 5/1999 | Kurshan et al. ............. | 703/6 |
| 6,347,388 B1 | * | 2/2002 | Hollander ................... | 714/739 |
| 7,421,668 B1 | * | 9/2008 | Ip et al. ..................... | 716/5 |
| 2005/0138585 A1 | * | 6/2005 | Cerny et al. ................ | 716/5 |
| 2009/0144683 A1 | * | 6/2009 | Lehavot et al. ............. | 716/6 |
| 2009/0164861 A1 | * | 6/2009 | Tseng ......................... | 714/739 |

\* cited by examiner

*Primary Examiner*—Hal D Wachsman
(74) *Attorney, Agent, or Firm*—Park, Vaughan & Kleming LLP; Laxman Samasrabuddhe

(57) ABSTRACT

One embodiment of the present invention provides systems and techniques to extract assume properties from a constrained random test-bench. During operation, the system can receive a constrained random test-bench for verifying the design-under-test (DUT), wherein the constrained random test-bench includes a statement which assigns a random value to a random variable according to a constraint. Next, the system can modify the constrained random test-bench by replacing the statement with another statement which assigns a free input variable's value to the random variable. The system can also add a statement to the constrained random test-bench that toggles a marker variable to localize the scope of the statement. The system can then generate an assume property which models the constraint on the free input variable. The assume property can then be used by a formal property verification tool to verify the DUT.

18 Claims, 10 Drawing Sheets

TEST-BENCH
202

```
...
program Test (input clk);

class Bus;
        rand bit [15:0] addr;         — 204
    endclass bit [15:0] X, Y;
    Bus B1 = new;                     — 206 initial begin
        ...
        @(posedge clk);               — 208
        B1.randomize();
        X = B1.addr;
        ...                           — 210
        ...
        @(posedge clk);
        Y = B1.addr;
        end                           — 212
endprogram
        ...
```

FIG. 2A

MODIFIED TEST-BENCH
252

```
...
...
program Test (input clk,
        input [15:0] addr);           — 254 bit [15:0] X, Y;

initial begin
        ...
        @(posedge clk);               — 256
        X = addr;
        ...
        ...
        @(posedge clk);
        Y = addr;
        end                           — 258
endprogram
        ...
        ...
```

FIG. 2B

MODIFIED TEST-BENCH
302

```
...
program Test (input clk,
    input [15:0] addr);                    — 304 class Bus;
      rand bit [15:0] addr;                — 306
  endclass bit [15:0] X, Y;
  Bus B1 = new;                            — 308 initial begin
    ...
      @(posedge clk);
      B1.addr = addr;                      — 310
      X = B1.addr;
                                           — 312
    ...
    ...
      @(posedge clk);
      Y = B1.addr;
    end                                    — 314
endprogram
    ...
```

FIG. 3

TEST-BENCH
402

```
...
...
program Test( input clk );

class Bus;
        rand bit [15:0] addr;
    endclass

Bus B1 = new;

initial begin
        ...
        @(posedge clk);
        B1.randomize() with       ⎫
            {addr <= 128;};       ⎬ 404
        ...                       ⎭
        ...
    end
endprogram
    ...
    ...
```

FIG. 4A

MODIFIED TEST-BENCH
452

```
...
...
program Test (input clk,
    input [15:0] addr);          ← 454 class Bus;
        rand bit [15:0] addr;
    endclass

Bus B1 = new;

initial begin
        ...
        @(posedge clk);
        B1.addr = addr;          ← 456
        ...
    end
endprogram property P;                       ⎫
    @(posedge clk)                ⎪
        (addr <= 128);            ⎬
endproperty                       ⎪ 458
                                  ⎪
assume_P:                         ⎪
    assume property (P);          ⎭
    ...
    ...
```

FIG. 4B

TEST-BENCH
502

```
...
...
program Test( input clk );

class Bus;
        rand bit [15:0] addr;
    endclass

Bus B1 = new;

initial begin
        ...
        @(posedge clk);
        B1.randomize() with      ⎫
           {addr <= 128;};       ⎬ 504
        ...                      ⎭
        ...

@(posedge clk);
        B1.randomize() with      ⎫
           {addr > 128 &&        ⎬
            addr <= 1024; };     ⎬ 506
        ...                      ⎭
        ...

end
endprogram
...
```

FIG. 5A

MODIFIED TEST-BENCH
552

```
...
program Test (input clk,
       input [15:0] addr);

class Bus;
        rand bit [15:0] addr;
    endclass

Bus B1 = new;

initial begin
        ...
        @(posedge clk);
        B1.addr = addr;
        ...
        @(posedge clk);
        B1.addr = addr;
        ...
    end
endprogram property P1;                     ⎫
    @(posedge clk)               ⎪
       (addr <= 128);            ⎬
endproperty                      ⎬ 554
                                 ⎪
assume_P1:                       ⎪
    assume property (P1);        ⎭ property P2;                     ⎫
    @(posedge clk)               ⎪
       (addr > 128 &&            ⎪
        addr <= 1024);           ⎬ 556
endproperty                      ⎪
                                 ⎪
assume_P2:                       ⎪
    assume property (P2);        ⎭
        ...
```

FIG. 5B

MODIFIED TEST-BENCH
602

```
...
...
program Test (input clk,
    input [15:0] addr,
    output bit flag1,
    output bit flag2);                    } 604 class Bus;
    rand bit [15:0] addr;
endclass

Bus B1 = new;

initial begin
    ...
    @(posedge clk);          ── 606
    flag1 = !flag1;
    B1.addr = addr;          ── 608
    ...
    ...
    @ (posedge clk);         ── 610
    flag2 = !flag2;
    B1.addr = addr;          ── 612
    ...
    ...
end
endprogram
...
...
```

FIG. 6

SET OF ASSUME PROPERTIES
702

```
...
...
property P1;
    @(posedge clk) !$stable (flag1) |-> (addr <= 128);
endproperty assume_P1: assume property (P1);

property P2;
    @(posedge clk) !$stable (flag2) |->
        (addr > 128 && addr <= 1024);
endproperty assume_P2: assume property (P2);
...
...
```

704 { property P1 ... assume_P1 block }
706 { property P2 ... assume_P2 block }

FIG. 7

TEST-BENCH
802

```
...
class Bus;
    rand bit [15:0] addr;

constraint word_align
        {addr[1:0] == 2'b0;}
endclass
...
B1.randomize();
...
```

804 { constraint word_align block }
806 → B1.randomize();

FIG. 8A

MODIFIED TEST-BENCH
852

```
...
B1.addr = addr;
...
property P1;
    @(posedge clk)
        (addr [1:0] == 2'b0);
endproperty assume_P1:
    assume property (P1);
...
```

854 → B1.addr = addr;
856 { property P1 ... assume_P1 block }

FIG. 8B

Input: A constrained Random Test-Bench (RTB)
Output: A set of assume properties (AP), and a modified RTB.

Begin

STEP 1201. For each random variable $r$
    Define a free input variable $f$ (of the same width)
  End of For Loop

STEP 1202. For each global constraint $G$ on a set of random variables
    1. Model a global assume property on the corresponding set of free input variables defining the constraint $G$
    2. Add the global assume property to the set of assume properties
  End of For Loop

STEP 1203. For each "randomize()" function
    1. Remove the "randomize()" function
    2. For each random variable associated with the "randomize()" function
        Add a statement that assigns the value of the corresponding free input variable to the random variable
    End of For Loop
  End of For Loop

STEP 1204. For each in-line constraint on a set of variables
    1. Define a marker variable
    2. Replace the in-line constraint by a flip event that flips the value of the marker variable
    3. For each random variable associated with the in-line constraint
        Add a statement that assigns the value of the corresponding free input variable to the random variable
    End of For Loop
    4. Model an assume property on the corresponding set of free input variables which triggers the in-line constraint when the marker variable is unstable
    5. Add the assume property to the set of assume properties
  End of For Loop

End

FIG. 12

METHOD AND APPARATUS FOR EXTRACTING ASSUME PROPERTIES FROM A CONSTRAINED RANDOM TEST-BENCH

FIELD OF THE INVENTION

The present invention generally relates to electronic design automation. More specifically, the present invention relates to methods and apparatuses for extracting assume properties from a constrained random test-bench.

BACKGROUND

Related Art

Rapid advances in computing technologies have been made possible by advances in design and verification tools. Indeed, without such tools it would have been almost impossible to design and verify complicated integrated circuits which are commonly found in today's computing devices.

Formal property verification is a powerful technique for verifying the functionality of a circuit design. In this technique, a hardware description and verification language, such as SystemVerilog, can be used to describe the design-under-test (DUT) and to describe assertions which represent the DUT's desired behavior. A formal property verification tool can then be used to prove the assertions or to generate counter examples which provide scenarios in which one or more assertions are violated. An important input to the formal property verification tool is a set of assume properties which constrains the environment under which the DUT is to be verified.

Unfortunately, it can be very time consuming and difficult to use conventional formal property verification tools, which is why many users shy away from using these tools. Hence, it is generally desirable to make it easier to use formal property verification tools.

SUMMARY

One embodiment of the present invention provides systems and techniques for facilitating formal property verification of a DUT. One of the reasons why users shy away from using formal verification tools is because creating assume properties can be difficult. However, users are quite experienced at creating constrained random test-benches which are used in simulation based verification solutions.

An embodiment of the present invention helps users to create assume properties. Specifically, the system can receive a constrained random test-bench for verifying the DUT. Next, the system can extract assume properties from the constrained random test-bench, and modify the constrained random test-bench so that it is in a format that is acceptable to a formal property verification tool. Since the system automatically extracts assume properties from a constrained random test-bench, it obviates the need for users to create assume properties.

BRIEF DESCRIPTION OF THE FIGURES

FIGS. 2A and 2B illustrate a technique for modifying a test-bench which can lead to incorrect results.

FIG. 3 illustrates a technique for modifying a test-bench which may not be able to handle in-line constraints in accordance with an embodiment of the present invention.

FIGS. 4A and 4B illustrate how a test-bench with in-line constraints can be modified in accordance with an embodiment of the present invention.

FIGS. 5A and 5B illustrate how multiple in-line constraints may result in conflicting assume properties.

FIG. 6 illustrates how marker variables can be used to mark portions of the test-bench where constraints were used in accordance with an embodiment of the present invention.

FIG. 7 illustrates how marker variables can be used to trigger assume properties in accordance with an embodiment of the present invention.

FIGS. 8A and 8B illustrate how an assume property can be extracted for a global constraint in accordance with an embodiment of the present invention.

FIG. 12 provides details of a process for extracting assume properties from a constrained random test-bench in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit (IC) Design Flow

Figure 1:
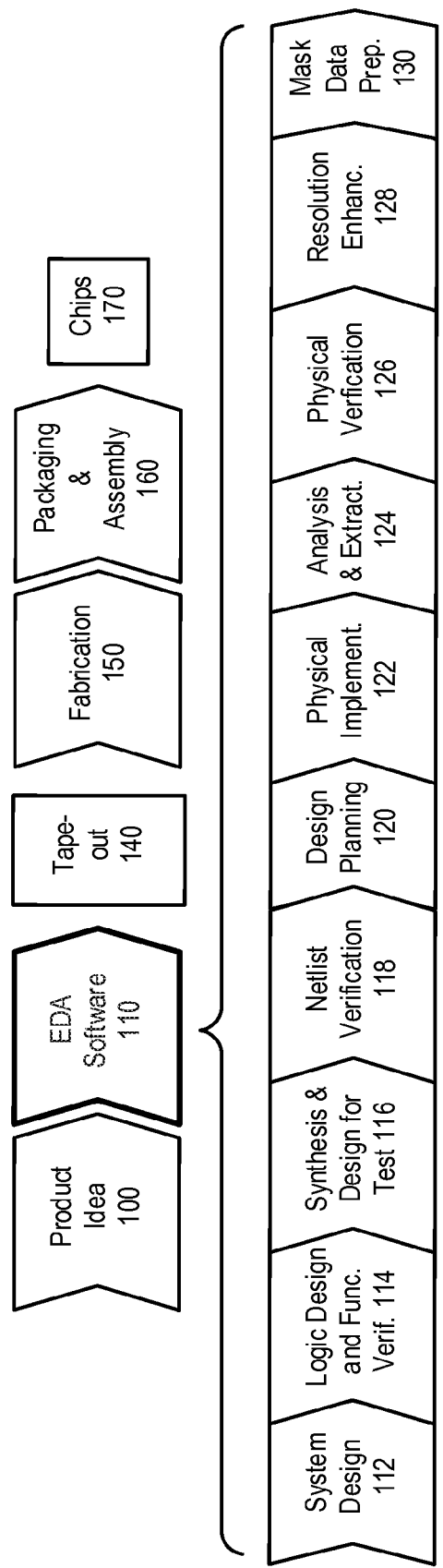
FIG. 1 illustrates various stages in the design and fabrication of an integrated circuit in accordance with an embodiment of the present invention.

FIG. 1 illustrates various stages in the design and fabrication of an integrated circuit in accordance with an embodiment of the present invention.

The process usually starts with a product idea (step 100) which is realized using an EDA process (step 110). Once the design is finalized, it is usually taped-out (event 140) and goes through the fabrication process (step 150) and packaging and assembly processes (step 160) to produce the finished chips (result 170).

The EDA process (step 110) comprises steps 112-130, which are described below for illustrative purposes only and are not meant to limit the present invention. For example, an actual integrated circuit design may require the designer to perform the design steps in a different sequence than the sequence described below.

System design (step 112): In this step, the designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS®, Vera®, DesignWare®, Magellan™, Formality®, ESP and Leda® products.

Synthesis and design for test (step 116): The VHDL/Verilog can be translated to a netlist in this stage. The netlist can be optimized for the target technology, and tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare®products.

Netlist verification (step 118): In this step, the netlist is checked for compliance with timing constraints and for correspondence with the VHDL/Verilog source code. Exemplary EDA software products from Synopsys, Inc. that can be used at this step include Formality®, PrimeTime®, and VCS® products.

Design planning (step 120): Here, an overall floorplan for the chip is constructed and analyzed for timing and top-level routing. Exemplary EDA software products from Synopsys, Inc. that can be used at this step include Astro™ and IC Compiler products.

Physical implementation (step 122): The placement (positioning of circuit elements) and routing (connection of the same) occurs at this step. Exemplary EDA software products from Synopsys, Inc. that can be used at this step include the Astro™ and IC Compiler products.

Analysis and extraction (step 124): At this stage, the circuit function is verified at a transistor level; this in turn permits what-if refinement. Exemplary EDA software products from Synopsys, Inc. that can be used at this step include AstroRail™, PrimeRail, PrimeTime®, and Star-RCXT™ products.

Physical verification (step 126): In this step, the design is checked to ensure correctness for manufacturing, electrical issues, lithographic issues, and circuitry. Exemplary EDA software products from Synopsys, Inc. that can be used at this step include the Hercules™ product.

Resolution enhancement (step 128): This step involves geometric manipulations of the layout to improve manufacturability of the design. Exemplary EDA software products from Synopsys, Inc. that can be used at this step include Proteus/Progen, ProteusAF, and PSMGen products.

Mask data preparation (step 130): This step provides the "tape-out" data for production of masks to produce finished chips. Exemplary EDA software products from Synopsys, Inc. that can be used at this step include the CATS® family of products.

Embodiments of the present invention can be used during one or more of the above-described steps. Specifically, one embodiment of the present invention can be used during the logic design and functional verification step 114.

Constrained Random Test-Bench

Defining the environment under which a given design under test (DUT) is supposed to work correctly is an important prerequisite for effective design verification. Traditionally, verification engineers have used a test-bench to model the environment of the DUT. The test-bench can be described using a hardware description language. The test-bench typically includes a set of tests which constrain the environment in an appropriate way so as to cover a targeted set of behaviors of the DUT.

Some hardware languages, such as SystemVerilog, support several advanced constructs for specifying constraints explicitly in a test-bench. The underlying test architecture of a test-bench tool can be randomized, which can enable the test-bench to cover more types of behaviors than the number of behaviors that a single directed test-bench would have covered. Explicit constraints can be used to restrict the random choices of the test-bench in a way that is consistent with its protocol with the DUT. Such test-benches are typically called constrained random test-benches.

Constraining the environment is a demanding task while developing a formal verification plan. Typically the DUT is expected to satisfy certain formal properties in its protocol with its environment assuming that the environment also behaves properly. Languages such as SystemVerilog Assertions (SVA) provide support for specifying assume properties, which are treated as constraints on the environment. However, the task of developing assume properties that restrict the environment correctly and adequately is challenging because the assume properties essentially need to model all aspects of the environment that directly or indirectly affect the environment's interaction with the DUT. For example, while verifying a master device in a bus architecture, the environment may model an arbitrary number of slave devices, other master devices and the bus arbiter. Conventional techniques for modeling a constrained environment are not automated, and hence, they can require substantial human intervention.

If a test-bench is synthesizable, then it is possible to extract a state machine model of the environment from it. Conventional formal property verification tools usually accept a synthesizable test-bench as another module.

A test-bench language may include constructs which are not synthesizable by conventional tools. This includes constructs like channels, fork-join, semaphores, etc. Various approaches can be used for synthesizing such constructs, though they may not be supported by conventional tools.

Extracting Assume Properties

Although verification engineers are quite adept at creating constrained random test-benches, they have not acquired the same level of expertise in creating formal models. Hence, it is desirable to develop systems and techniques for automatically extracting a formal model from a constrained random test-bench. One embodiment of the present invention provides systems and techniques for handling the constructs for randomization and constraint specification within the larger problem of extracting a formal model from a constrained random test-bench.

A language for writing test-benches may support a method or function, e.g., "randomize( )," for randomizing variables. For example, in the code shown below, the "addr" variable in object "B1" is randomized by invoking the "randomize( )" method:

```
class Bus;
    rand bit  [15:0] addr;
endclass
Bus B1 = new;
B1.randomize( );
```

The effect of invoking the "randomize( )" method is that each "rand" variable in the object is assigned a random value. In the equivalent formal model of the test-bench, we may be tempted to interpret this as a non-deterministic choice of the valuation of the object. One methodology for modeling such non-determinism is to declare the randomized variables as free input variables. The semantics of model checking would then automatically verify all formal properties over all possible valuations of those inputs.

However, if we are not careful, this technique for modifying a test-bench for formal property verification purposes can lead to incorrect results as demonstrated by the following example.

FIGS. 2A and 2B illustrate a technique for modifying a test-bench which can lead to incorrect results.

Test-bench 202 defines a "Bus" class which includes statement 204 which defines a random variable "addr." Statement 206 instantiates class "Bus" to create object "B1." Statement 208 invokes the "randomize( )" method of the "B1" object which assigns a random value to the variable "B1.addr." Statements 210 and 212 assign this random value to the variables "X" and "Y," respectively.

A constrained random test-bench is used for modeling a DUT's environment and for verifying the DUT under random signal values. A constrained random test-bench typically uses a randomization function, e.g., "randomize( )," to generate the random signal values. Note that this approach may not test the DUT for all valid signal values. In contrast, a formal property verification tool attempts to formally prove that a DUT will behave properly under all valid signal values. Since formal property verification tools are not based on verifying the DUT by providing random stimuli, they do not use randomization functions such as "randomize( )." Hence, the constrained random test-bench code (which includes calls to randomization functions) is usually not understood by a formal property verification tool. As a result, the constrained random test-bench may need to be modified so that it can be provided to a formal property verification tool.

Modified test-bench 252 is an attempt to create a test-bench that can be used with a formal property verification tool. Statement 254 defines a free input variable called "addr." Statements 256 and 258 assign the value of the free input variable "add" to random variables "X" and "Y," respectively. At first glance, it may seem that, if modified test-bench 252 is provided to a formal property verification tool, the tool will be able to prove the DUT's correctness for input conditions that were specified in the constrained random test-bench.

Unfortunately, that is not true, and modified test-bench 252 may lead to incorrect results. The main discrepancy in modified test-bench 252 is that the free input, "addr," is free to change its value in every clock cycle. On the other hand, in test-bench 202, once variable "B1.addr" is assigned a random value by invoking the method "B1.randomize( )," the value of "B1.addr" remains stable. As a result, the values assigned to "X" and "Y" are the same in test-bench 202, whereas in modified test-bench 252, they can be different. This can cause the formal property verification tool to report false negatives, i.e., the formal property verification tool may incorrectly report that the DUT is not expected to behave as desired.

In other words, if we use the technique illustrated in FIG. 2 to modify the test-bench, it will admit more behaviors than those allowed by the original test-bench. Under-constraining the environment in this manner may cause a formal property verification to report false negatives, i.e., the tool may obtain false counter-examples.

One approach to overcome this problem is to save the value of every free input variable in a register where the original test-bench was using the "randomize( )" function. This technique is illustrated by the following example.

FIG. 3 illustrates a technique for modifying a test-bench which may not be able to handle in-line constraints in accordance with an embodiment of the present invention.

Modified test-bench 302 overcomes the problems with modified test-bench 252. Statement 304 defines a free input variable called "addr." In contrast to modified test-bench 252, modified test-bench 302 defines a "Bus" class which includes statement 306 which defines a random variable "addr." Statement 308 instantiates class "Bus" to create object "B1." Instead of invoking the "randomize( )" method, statement 310 assigns the value of the free input variable "addr" to the random variable "B1.addr." Statements 312 and 314 assign this random value, i.e., the value of the random variable "B1.addr," to the variables "X" and "Y," respectively.

The problem with modified test-bench 252 does not arise here, since the value of "B1.addr" remains stable after it is assigned the value of free input variable "addr." Note that modified test-bench 302 is essentially the same as test-bench 202, except for two modifications: the free input variable "addr" which is defined in statement 304, and the "randomize( )" method invocation in statement 208 has been replaced by the assignment in statement 310.

Unfortunately, although the test-bench modification technique illustrated in FIG. 3 may work for some test-benches, it may not work when constraints are present. The "randomize( )" function is often accompanied by constraint specifications (also called in-line constraints) which constrain the values that the "randomize( )" function assigns to random variables. The following example illustrates the use of in-line constraints. We assume that the initial state of the test bench follows the global constraints defined in the test-bench. Therefore, in the initial state, there would be no in-line constraints. An example of how such global test bench constraints can be handled is described in FIG. 8.

FIGS. 4A and 4B illustrate how a test-bench with in-line constraints can be modified in accordance with an embodiment of the present invention.

Test-bench 402 is similar to test-bench 202. Specifically, test-bench 402 defines the "Bus" class and instantiates the "Bus" class to create object "B1." Suppose we want to randomize the variable "addr" in the "B1" object within the range [0, 128]. We can do that using statement 404 which constrains the "randomize( )" method invocation with the in-line constraint "{addr <=128;}."

An embodiment of the present invention uses the following insight: in-line constraints can be interpreted as assume properties within the formal model of the environment. Specifically, just like modified test-bench 302, modified test-bench 452 defines free input variable "addr" in statement 454, and uses the free input variable to assign a random value to the variable "B1.addr" in statement 456. The in-line constraint shown in statement 404 is handled using assume property which is defined in statements 458, and which models the constraint on the free input variable "addr." Note that the in-line constraint in statement 404 ensured that the "B1.addr" variable was assigned a random value in the range [0, 128]. The assume property defined in statements 458 causes the formal property verification tool to assume that the value of the free input variable "addr" falls within the range [0, 128].

Unfortunately, the approach illustrated in FIG. 4 may not work in certain situations. Specifically, an object may be randomized several times in the same test-bench, possibly with different constraints. If we use the approach illustrated in FIG. 4, the assume properties defined for two (or more) instances of randomization on the same object may conflict.

FIGS. 5A and 5B illustrate how multiple in-line constraints may result in conflicting assume properties.

Test-bench 502 includes two invocations of the "randomize( )" method with two different in-line constraints. Statement 504 imposes the constraint "{addr <=128;}" on the randomization, whereas statement 506 imposes the constraint "{addr>128 && addr <=1024;}" on the randomization. Clearly, these constraints are incompatible with one another, but, since they are applied at two separate states of the test-bench, they don't conflict with each other.

However, if we use the approach illustrated in FIG. 4, we will end up with conflicting assume properties. Test-bench 502 can be modified to obtain modified test-bench 552. The in-line constraints specified in statements 504 and 506 can result in the assume properties "P1" and "P2" described in statements 554 and 556, respectively. Unfortunately, the assume properties "P1" and "P2" refer to the same free input variable "addr," and hence, they conflict with each other.

One approach to overcome this problem is to declare a separate free input variable for each instance of randomization for the same object. However, this approach can lead to an explosion in the number of free input variables that the formal property verification tool will have to handle. Hence, a better approach is desirable.

The problem with the approach illustrated in FIG. 4 and FIG. 5 is that the approach defines the assume properties as global constraints, whereas in the original test-bench, the scope of the in-line constraints was local to the statement where the "randomize( )" function was called.

One embodiment of the present invention provides systems and techniques for modifying the test-bench and for extracting assume properties so that the scope of the extracted assume properties is localized. Specifically, an embodiment uses the following insight: the assume properties can be localized if the test-bench is modified so that it uses marker variables to "mark" portions of the test-bench where constraints are used, and the marker variables are then used to trigger the assume properties.

For example, an embodiment can define a free input variable $X_E$ for each random variable X. Next, the embodiment can replace each occurrence of the "randomize( )" construct with a flip-event (toggling) of a unique marker variable $M_X$ which is associated with the random variable X. The system can then assign the value of the free input variable $X_E$ to the random variable X. Note that this assignment and the flip-event occur substantially at the same time, e.g., during the same clock cycle. For example, the statement that toggles the marker variable $M_X$, and the statement that assigns the value of the free input variable $X_E$ to the random variable X, can be consecutive statements in the test-bench. These modifications to the test-bench can ensure that each randomized variable X is assigned the value of the corresponding free input variable, $X_E$, whenever the corresponding marker variable $M_X$ is toggled. The scope of the assume property can now be localized by triggering the assume property whenever the marker variable $M_X$ is toggled.

FIG. 6 illustrates how marker variables can be used to mark portions of the test-bench where constraints were used in accordance with an embodiment of the present invention.

In statement 604, modified test-bench 602 defines free input variable "addr" and marker variables "flag1" and "flag2." The "randomize( )" method invocation in statement 504 has been replaced by statement 608 which assigns the value of free input variable "addr" to the random variable "B1.addr." The "randomize( )" method invocation in statement 506 has been replaced by statement 612 which assigns the value of free input variable "addr" to the random variable "B1.addr." Statement 606 toggles marker variable "flag1" which marks the application of statement 504, and statement 610 toggles marker variable "flag2" which marks the application of statement 506.

FIG. 7 illustrates how marker variables can be used to trigger assume properties in accordance with an embodiment of the present invention.

Each flip-event in the modified test-bench can be used to activate the corresponding "assume property" during formal property verification. Specifically, set of assume properties 702 includes assume properties 704 and 706 which correspond to the in-line constraints shown in statements 504 and 506, respectively. In assume property 704, the constraint "addr <=128" is triggered by the expression "!$stable(flag1)." The expression "!$stable(flag1)" evaluates to a true value when marker variable "flag1" is toggled. As a result, the constraint "addr <=128" is applied when statement 606 is executed, thereby localizing the scope of the constraint.

Similarly, in assume property 706, the constraint "addr>128 && addr <=1024" is triggered by the expression "!$stable(flag2)," which evaluates to a true value when marker variable "flag2" is toggled. Hence, the constraint "addr>128 && addr <=1024" is applied when statement 608 is executed, thereby localizing the scope of the constraint. Note that although assume properties 704 and 706 operate on the same free input variable, "addr," they do not conflict with each other because their scope has been localized using marker variables "flag1" and "flag2." We assume that the handshaking between the DUT and the test-bench is synchronous in nature. In this model, the test-bench generates a set of signal values (input to the DUT), which are sampled by the DUT in the next sampling clock edge. In the formal model, the assume properties also restrict the input signal values (driven from the test-bench) before the next sampling clock edge of the DUT. In this manner, the semantics of constraining the input values from the test-bench remains intact in the formal model.

In this manner, an embodiment of the present invention can modify a constrained random test-bench so that the modified test-bench does not include calls to randomization methods and does not include in-line constraints. Note that other constructs in the test-bench may also need to be translated or modified before the test-bench can be provided to a formal property verification tool.

In addition to in-line constraints, a hardware description and verification language may also include global constraints. The scope of a global constraint may span the entire life-time of a test-bench.

FIGS. 8A and 8B illustrate how an assume property can be extracted for a global constraint in accordance with an embodiment of the present invention.

Test-bench 802 defines class "Bus" which includes a random variable "addr," and constraint "word_align" 804. Whenever the "Bus" is randomized, e.g., in statement 806, the random variable "addr" is assigned a value that is consistent with constraint "word_align" 804. In the modified test-bench 852, constraint "word_align" 804 is removed, and the assume property "P1" 856 is added which imposes the constraint described in "word_align" on the free input variable "addr."

As before, in modified test-bench 852, the value of the free input variable "addr" can be assigned to the random variable "B1.addr," e.g., in statement 854. The assume property "P1" will ensure that the formal property verification tool will impose the constraint "addr[1:0]==2'b0" on the free input variable "addr." As a result, the formal property verification tool will treat the random variable "B1.addr" in a manner that is consistent with the global constraint that was defined in the class "Bus." Note that, if no additional in-line constraints are used while invoking the "randomize( )" method on the "B1" object, we will not need any marker variables to localize the scope of the assume properties.

Process for Extracting Assume Properties

Figure 9:
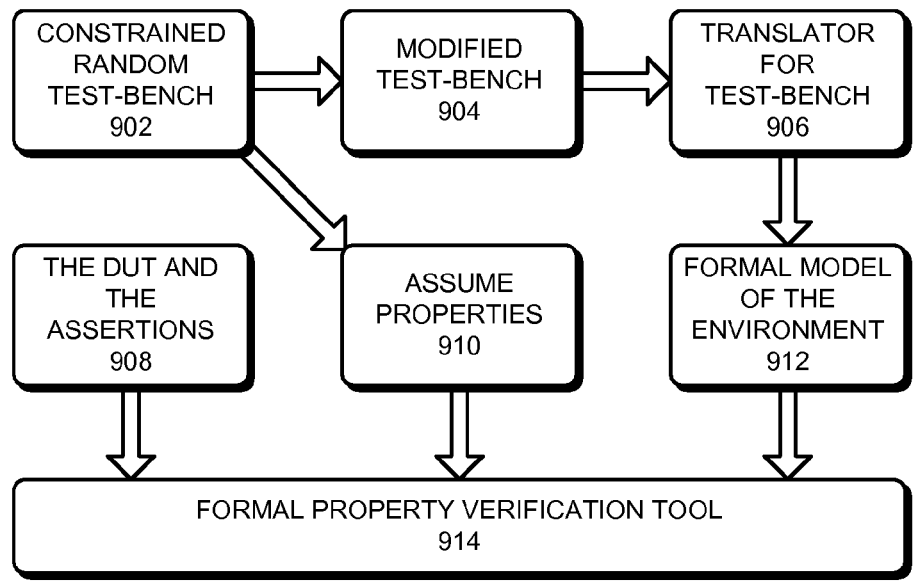
FIG. 9 illustrates how assume property extraction can be used to perform formal property verification of a DUT in accordance with an embodiment of the present invention.

FIG. 9 illustrates how assume property extraction can be used to perform formal property verification of a DUT in accordance with an embodiment of the present invention.

A formal property verification tool typically receives as input a description of the DUT and the assertions 908. The description of the DUT enables the formal property verification tool to model how the DUT behaves, and the assertions describe the desired behavior of the DUT. Note that the term "property" is sometimes used instead of the term "assertion." However, when the term "property" is used in this context, it should not be confused with the term "assume property" because these are fundamentally different concepts. Specifically, an assertion (or a "property" when it is used in this context) describes a desired behavior of a DUT, whereas an assume property describes a constraint on the environment that is used for verifying the DUT.

During formal property verification, the tool attempts to prove that the DUT will behave as desired. To ensure that the formal model is not under-constrained, a set of assume properties typically needs to be provided to the formal property verification tool. An embodiment of the present invention can be used to generate a set of assume properties and to generate a formal model for the environment which is used for verifying the DUT.

Specifically, an embodiment of the present invention can be used to obtain modified test-bench 904 by modifying constrained random test-bench 902, and to obtain assume properties 910 by extracting them from constrained random test-bench 902. Modified test-bench 904 can then be translated using translator for test-bench 906 to obtain formal model of the environment 912. Translator for test-bench 906 can translate test-bench constructs, such as channels, fork-join, and synchronization constructs, into a semantically equivalent format that is acceptable to formal property verification tool 914. Finally, the description of the DUT and the assertions 908, assume property 910, and formal model of the environment 912 can be supplied as input to formal property verification tool 914.

Figure 10:
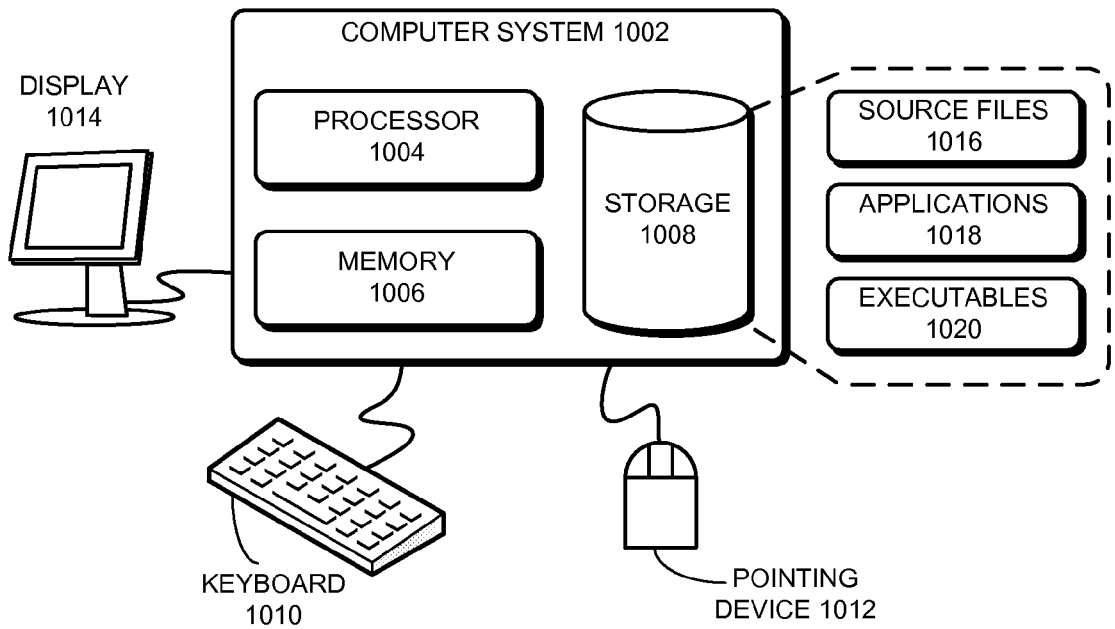
FIG. 10 illustrates a computer system in accordance with an embodiment of the present invention.

FIG. 10 illustrates a computer system in accordance with an embodiment of the present invention.

Computer system 1002 comprises processor 1004, memory 1006, and storage device 1008. Computer system 1002 can be coupled to display 1014, keyboard 1010, and pointing device 1012. Storage device 1008 can store source files 1016, applications 1018, and executables 1020. Processor 1004 can include one or more cores, and/or computer system 1002 can include a multiprocessor system.

During operation, computer system 1002 can load an application into memory 1006. Next, a user can use one or more applications to modify, translate, or compile source files 1016 to generate one or more executables, which can be stored on a computer-readable storage medium, such as storage device 1008. Computer system 1002 can load an executable into memory 1006 and execute instructions stored in the executable using processor 1004. Source files 1016 can include a description of the DUT, the assertions, and a constrained random test-bench. Applications 1018 can include an embodiment of the present invention which is used to modify the constrained random test-bench.

Figure 11:
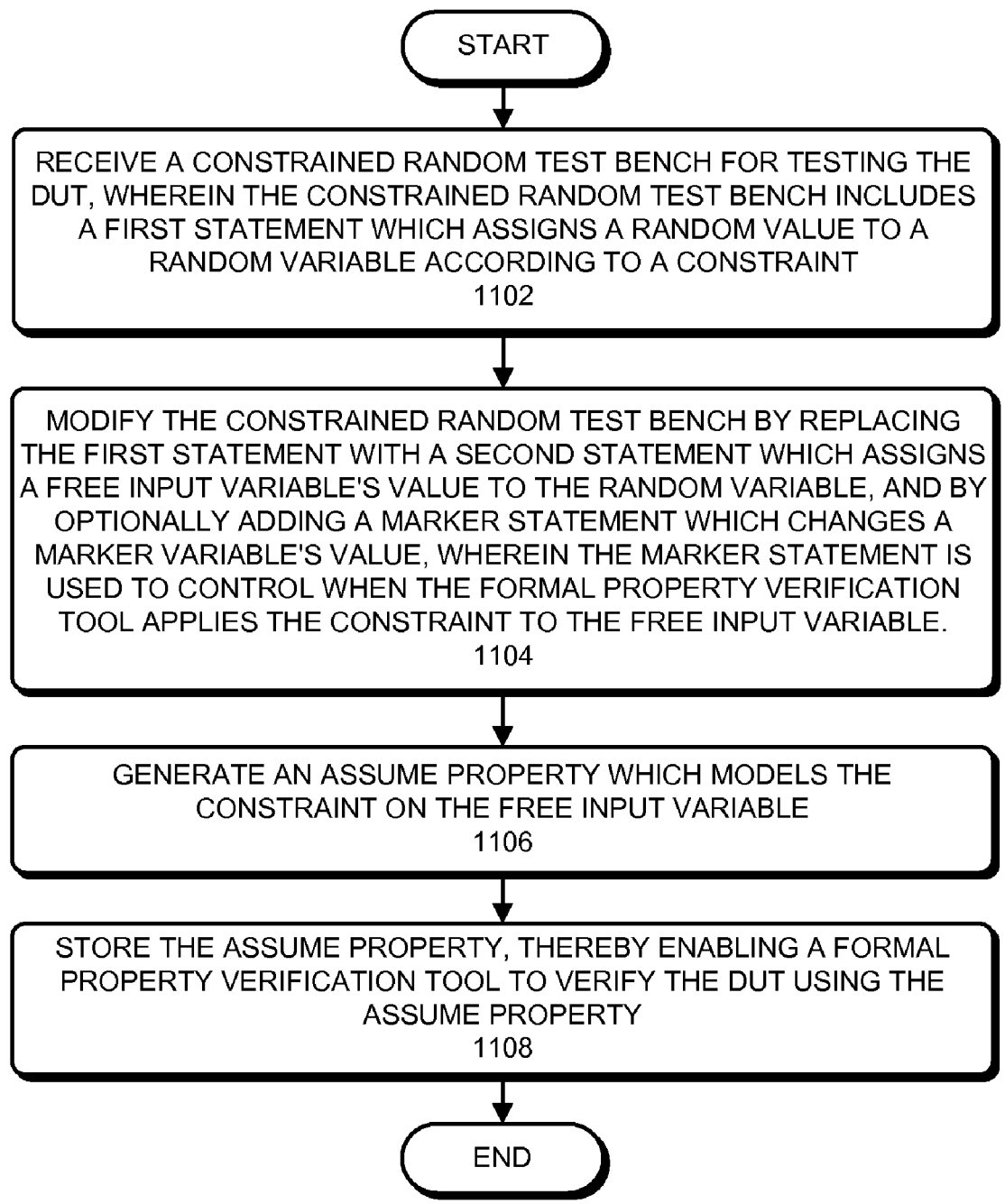
FIG. 11 presents a flowchart which illustrates a process for extracting assume properties from a constrained random test-bench in accordance with an embodiment of the present invention.

FIG. 11 presents a flowchart which illustrates a process for extracting assume properties from a constrained random test-bench in accordance with an embodiment of the present invention.

The process can begin by receiving a constrained random test-bench for verifying the DUT, wherein the constrained random test-bench includes a first statement which assigns a random value to a random variable according to a constraint (step 1102).

In one embodiment, a random variable is a variable which is used to randomize the environment for verifying the DUT. Specifically, the random variable can be part of an object which supports a randomization method which when invoked can cause a random value to be assigned to the random variable according to an in-line constraint. In one embodiment, the in-line constraint specifies a range of values that is assignable to the random variable.

Next, the system can modify the constrained random test-bench by replacing the first statement with a second statement which assigns a free input variable's value to the random variable, and by optionally adding a marker statement which changes a marker variable's value, wherein the marker statement is used to control when the formal property verification tool applies the constraint to the free input variable (step 1104).

In one embodiment, a free input variable is a variable whose value is unconstrained. In contrast, a random variable's value may be constrained using an in-line constraint. The system can add a marker statement which changes a marker variable's value. The marker statement is used to control when the formal property verification tool applies the constraint to the free input variable. Specifically, the assume property can include a marker expression which includes the marker variable. The marker expression can cause the formal property verification tool to apply the constraint to the free input variable after the marker statement is executed. The marker statement can toggle the marker variable's value. The marker expression returns a true value when the marker variable's value is toggled.

The system can then generate an assume property which models the constraint on the free input variable (step 1106).

Next, the system can store the assume property, thereby enabling a formal property verification tool to verify the DUT using the assume property (step 1108). Specifically, formal property verification tool typically generates results which indicate whether the DUT is expected to behave as desired. During operation, the formal property verification tool can use the assume property to constrain the values that it assumes for the free input variable.

FIG. 12 provides details of a process for extracting assume properties from a constrained random test-bench in accordance with an embodiment of the present invention.

The process shown in FIG. 12 includes steps 1201, 1202, 1203, and 1204. In step 1201, the system can define a free input variable for each random variable in the constrained random test-bench. Next, in step 1202, the system can generate assume properties for global constraints. In step 1203, the system can replace calls to the "randomize( )" method with a statement that assigns the value of a free input variable to the random variable. Next, in step 1204, the system can add statements that toggle marker variables, and generate assume properties which are triggered when the marker variables are unstable.

CONCLUSION

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method to facilitate formal property verification of a design-under-test (DUT), the method comprising:
    receiving a constrained random test-bench for verifying the DUT, wherein the constrained random test-bench includes a first statement which assigns a random value to a random variable according to a constraint;
    modifying the constrained random test-bench by replacing the first statement with a second statement which assigns a free input variable's value to the random variable;
    using one or more computers for generating an assume property which models the constraint on the free input variable; and
    performing formal property verification on the DUT, wherein the formal property verification uses the assume property to constrain the values for the free input variable.

2. The method of claim 1, wherein modifying the constrained random test-bench includes adding a marker statement which changes a marker variable's value, wherein the marker statement is used to control when the constraint is applied to the free input variable.

3. The method of claim 2, wherein the assume property includes a marker expression which includes the marker variable, wherein the marker expression causes the constraint to be applied to the free input variable after the marker statement is executed.

4. The method of claim 3, wherein the marker statement toggles the marker variable's value, and wherein the marker expression returns a true value when the marker variable's value is toggled.

5. The method of claim 1, wherein the random variable is part of an object which supports a randomization method which when invoked causes the random value to be assigned to the random variable according to the constraint.

6. The method of claim 1, wherein the constraint specifies a range of values that is assignable to the random variable.

7. A non-transitory computer-readable storage medium storing instructions that when executed by a computer cause the computer to perform a method to facilitate formal property verification of a design-under-test (DUT), the method comprising:
    receiving a constrained random test-bench for verifying the DUT, wherein the constrained random test-bench includes a first statement which assigns a random value to a random variable according to a constraint;
    modifying the constrained random test-bench by replacing the first statement with a second statement which assigns a free input variable's value to the random variable;
    generating an assume property which models the constraint on the free input variable; and
    performing formal property verification on the DUT, wherein the formal property verification uses the assume property to constrain the values for the free input variable.

8. The non-transitory computer-readable storage medium of claim 7, wherein modifying the constrained random test-bench includes adding a marker statement which changes a marker variable's value, wherein the marker statement is used to control when the constraint is applied to the free input variable.

9. The non-transitory computer-readable storage medium of claim 8, wherein the assume property includes a marker expression which includes the marker variable, wherein the marker expression causes the constraint to be applied to the free input variable after the marker statement is executed.

10. The non-transitory computer-readable storage medium of claim 9, wherein the marker statement toggles the marker variable's value, and wherein the marker expression returns a true value when the marker variable's value is toggled.

11. The non-transitory computer-readable storage medium of claim 7, wherein the random variable is part of an object which supports a randomization method which when invoked causes the random value to be assigned to the random variable according to the constraint.

12. The non-transitory computer-readable storage medium of claim 7, wherein the constraint specifies a range of values that is assignable to the random variable.

13. An apparatus to facilitate formal property verification of a design-under-test (DUT), the apparatus comprising:
    a processor; and
    a non-transitory computer-readable storage medium storing instructions that when executed by the processor cause the apparatus to perform a method to facilitate formal property verification of a design-under-test (DUT), the instructions comprising:
        instructions for receiving a constrained random test-bench for verifying the DUT, wherein the constrained random test-bench includes a first statement which assigns a random value to a random variable according to a constraint;
        instructions for modifying the constrained random test-bench by replacing the first statement with a second statement which assigns a free input variable's value to the random variable;
        instructions for generating an assume property which models the constraint on the free input variable; and
        instructions for performing formal property verification on the DUT, wherein the formal property verification uses the assume property to constrain the values for the free input variable.

14. The apparatus of claim 13, wherein the instructions for modifying the constrained random test-bench include instructions for adding a marker statement which changes a marker variable's value, wherein the marker statement is used to control when the constraint is applied to the free input variable.

15. The apparatus of claim 14, wherein the assume property includes a marker expression which includes the marker variable, wherein the marker expression causes the constraint to be applied to the free input variable after the marker statement is executed.

16. The apparatus of claim 15, wherein the marker statement toggles the marker variable's value, and wherein the marker expression returns a true value when the marker variable's value is toggled.

17. The apparatus of claim 13, wherein the random variable is part of an object which supports a randomization method which when invoked causes the random value to be assigned to the random variable according to the constraint.

18. The apparatus of claim 13, wherein the constraint specifies a range of values that is assignable to the random variable.

* * * * *